United States Patent
Simonato et al.

(10) Patent No.: US 9,422,628 B2
(45) Date of Patent: Aug. 23, 2016

(54) PROCESS FOR IMPROVING THE ELECTRICAL AND OPTICAL PERFORMANCE OF A TRANSPARENT ELECTRICALLY CONDUCTIVE MATERIAL BASED ON SILVER NANOWIRES

(71) Applicant: Commissariat A L'Energie Atomique Et Aux Energies Alternatives, Paris (FR)

(72) Inventors: Jean-Pierre Simonato, Sassenage (FR); Alexandre Carella, Mazeres Lezons (FR); Caroline Celle, Firminy (FR)

(73) Assignee: Commissariat a L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/405,872

(22) PCT Filed: Jun. 3, 2013

(86) PCT No.: PCT/IB2013/054562
§ 371 (c)(1),
(2) Date: Dec. 5, 2014

(87) PCT Pub. No.: WO2013/182969
PCT Pub. Date: Dec. 12, 2013

(65) Prior Publication Data
US 2015/0144590 A1 May 28, 2015

(30) Foreign Application Priority Data
Jun. 5, 2012 (FR) ...................... 12 55226

(51) Int. Cl.
*C23F 1/00* (2006.01)
*B82Y 40/00* (2011.01)
*C30B 29/60* (2006.01)
*C30B 29/62* (2006.01)
*C30B 33/10* (2006.01)
*B82Y 10/00* (2011.01)
*H01L 29/41* (2006.01)
*H01B 1/02* (2006.01)
*H01B 13/00* (2006.01)
*H01L 29/06* (2006.01)

(52) U.S. Cl.
CPC . *C23F 1/00* (2013.01); *B82Y 10/00* (2013.01); *B82Y 40/00* (2013.01); *C30B 29/605* (2013.01); *C30B 29/62* (2013.01); *C30B 33/10* (2013.01); *H01B 1/02* (2013.01); *H01B 13/00* (2013.01); *H01L 29/413* (2013.01); *H01L 29/0673* (2013.01)

(58) Field of Classification Search
None
See application file for complete search history.

(56) References Cited

U.S. PATENT DOCUMENTS

| | | |
|---|---|---|
| 2008/0143906 A1* | 6/2008 | Allemand et al. .............. 349/43 |
| 2010/0101832 A1* | 4/2010 | Verhaverbeke et al. ... 174/126.2 |
| 2013/0342221 A1* | 12/2013 | Virkar et al. .................. 324/661 |
| 2014/0001421 A1* | 1/2014 | Lockett et al. ................ 252/514 |
| 2014/0054516 A1* | 2/2014 | Moon et al. ................... 252/514 |

OTHER PUBLICATIONS

International Search Report and Written Opinion from International Application No. PCT/IB2013/054562 dated Sep. 12, 2013.
Cai-Hong, Liu et al.; "Silver Nanowire-Based Transparent, Flexible, and Conductive Thin Film"; *Nano Scale Research Letters Springer-Verlag USA*; vol. 6, No. 1; 2011; XP002688287.

* cited by examiner

*Primary Examiner* — Anita Alanko
(74) *Attorney, Agent, or Firm* — Alston & Bird LLP

(57) ABSTRACT

The invention relates to a process for improving the electrical and optical performance of a transparent electrically conductive material having silver nanowires. The invention also relates to a process for manufacturing a film made of a transparent electrically conductive material, such as a transparent electrode, a transparent heating film, or a film for electromagnetic shielding. The process of the invention includes the following steps: a) a step of bringing silver nanowires into contact with an acid solution, this solution having a pH lower than 7, preferably lower than 3; and b) a step of eliminating the acid. The field of application of the invention is in particular the field of optoelectronics.

9 Claims, No Drawings

PROCESS FOR IMPROVING THE ELECTRICAL AND OPTICAL PERFORMANCE OF A TRANSPARENT ELECTRICALLY CONDUCTIVE MATERIAL BASED ON SILVER NANOWIRES

The invention relates to a process for improving the electrical and optical performances of a transparent electrically conductive material comprising silver nanowires.

FIELD

It also relates to a process for manufacturing a layer made of a transparent electrically conductive material, such as a transparent electrode or a transparent heating film.

BACKGROUND

Materials possessing an optimal combination of high electrical conductivity, optical transparency and flexibility are components that are extremely important to the development of many high value-added fields, and especially any field related to "large area" electronics, i.e. electronics produced by printing techniques and at low temperatures.

The transparent electrodes usually used are manufactured from metal oxides (indium tin oxide, fluorine-doped tin oxide, etc.) and are not flexible. They lose their conductive performances when they are bent with small radii of curvature (for example smaller than 8 mm, and especially repeatedly).

Recent advances in the field of nanotechnology have made it possible today to foresee credible alternative ways of producing thin transparent heating films. Specifically, a number of transparent electrodes based on carbon nanotubes, graphene, polymers (such as PEDOT:PSS) or metal nanowires (metal=essentially silver) have been reported. These transparent electrodes may be produced on transparent plastic films and therefore identified as flexible transparent electrodes.

Up to now, the best performances have been obtained with metal nanowires. The transparent conductive system is obtained by manufacturing a percolating network of metal nanowires on a surface. These networks are obtained by depositing a suspension of nanowires in a solvent (water, methanol, isopropanol, etc.). The networks of silver nanowires have a low sheet resistance at 90% transmittance (measured at 550 nm), typically lower than 60 ohms/square (Yu, Zhang et al. 2011, "*Highly Flexible Silver Nanowire Electrodes for Shape-Memory Polymer Light-Emitting Diodes*" *Advanced Materials* 23(5): 664-668).

For example, for an optoelectronic device application, a low electrical resistance facilitates the passage of current. By way of example, this may improve the performances of photovoltaic cells (efficiency) or of display screens based on OLEDs (organic light-emitting diodes) or PLEDs (polymer light-emitting diodes) (higher luminous efficacy).

In another example, that of flexible transparent heating films, decreasing resistance allows heating performances to be improved, because the thermal power dissipated by the heating film is proportional to $V^2/R$ (Joule heating). Here V is the DC (direct current) voltage applied across the terminals of the heating film and R is the resistance of the device from one terminal to the other.

It would be desirable to improve said existing performances further.

SUMMARY

For this purpose, the invention provides a process for improving the electrical and optical performances of a transparent electrical material comprising silver nanowires, characterized in that it comprises:

a) a step of bringing the silver nanowires into contact with a solution of an acid, this solution having a pH lower than 7 and preferably lower than 3; and b) a step of removing the acid.

In a first variant, steps a) and b) are carried out on the silver nanowires before the transparent electrical material is manufactured.

In a second variant, steps a) and b) are carried out once the transparent electrical material has been manufactured.

In each and every variant, in step a) the acid solution is preferably an aqueous solution of nitric acid, or of sulfuric acid, or of acetic acid, or of formic acid, or of phosphoric acid, or of trifluoroacetic acid, and more preferably of nitric acid, said acid solution preferably having an acid content higher than or equal to 0.2% and lower than or equal to 20% by weight of acid relative to the total weight of the solution.

Also preferably, in step a) the contact lasts is carried out during between 2 to 10 min, preferably 3 to 7 min, at room temperature.

The invention also provides a process for manufacturing a layer made of a transparent electrically conductive material based on silver nanowires, which comprises a step of implementing the process for improving the electrical and optical performances of a transparent electrical material according to the invention.

The invention also provides a process for manufacturing a transparent conductive electrode, which comprises a step of implementing the process for improving the electrical and optical performances of a transparent electrical material according to the invention.

The invention also provides a process for manufacturing a transparent heating film, which comprises a step of implementing the process for improving the electrical and optical properties of a transparent electrical material according to the invention.

The invention lastly provides a process for manufacturing a conductive film that makes electromagnetic shielding possible.

The invention will be better understood and other features and advantages thereof will become more clearly apparent on reading the following explanatory description.

DETAILED DESCRIPTION

The invention provides a process for improving the electrical and optical performances of a transparent electrically conductive material based on silver nanowires.

These transparent electrically conductive materials based on silver nanowires are known.

They are manufactured by various processes such as techniques, employing nanowire solutions, such as nebulization, spin coating, coating, screen printing, etc. for printing the various components of the layer (including the silver nanowires) on a substrate that may be stiff or flexible, even stretchable (extension of less than 20%) and the surface of which may be planar or structured (presence of patterns or substantial roughness).

The layer obtained may be used as a transparent electrode, essentially for optoelectronic devices, or as a heating layer, by applying a voltage across the terminals of the layer, or even as a conductive film for shielding.

However, it is desirable for such layers to have both a high transmittance and a low electrical resistance.

In such a layer, a percolating network of silver nanowires is obtained that has a transmittance higher than 50%, when measured at 550 nm by UV-VIS-NIR spectrometry using the substrate employed, which in general is glass or polyethylene naphthalate (PEN), as a reference, and a sheet resistance lower than 200 ohms/square (measured by a Loresta EP 4-point resistivity meter).

The spectrophotometer used is a Varian Cary 5000 spectrophotometer.

In order to further improve the transmittance and decrease the electrical resistance of such layers, the invention proposes to treat the silver nanowires, before or after the actual process for manufacturing the layer of transparent electrical material has been carried out, with an acid solution.

It is particularly surprising that such an acid treatment allows the electrical and optical performances of a transparent electrical material comprising silver nanowires to be improved because it is extremely well known in the art that acids, in particular nitric acid, are excellent solubilizing agents of silver.

Silver nitrate, for example, is conventionally obtained by dissolving metal agents in a nitric acid solution.

Moreover, the inventors have in particular observed that an electrode comprising silver nanowires left in nitric acid 65% for 15 min is completely dissolved and that the dissolved silver may be found in solution, as shown by quantitative analysis, for example using the ICP-OES (inductively coupled plasma spectroscopy) technique with an Agilent Series 700 spectrometer.

Thus, the man skilled in the art would have a priori rejected the idea of carrying out a treatment with an acid, in particular nitric acid, on silver nanowires, these nanowires being extremely thin (silver nanowires are objects at least one dimension of which is smaller than or equal to 1 µm), because a priori this treatment would necessarily destroy or at least very severely damage said silver nanowires and therefore deteriorate the properties of the layer of transparent electrical material manufactured or to be manufactured.

However, the inventors have noticed that, surprisingly, bringing silver nanowires, when they are dispersed in a solvent such as water or an alcohol, into contact with a solution of nitric, sulfuric, acetic, formic, phosphoric or trifluoroacetic acid, especially and more particularly of nitric acid the pH of which is lower than 7 and more preferably lower than 3, does not cause the silver nanowires to dissolve and that electrodes produced with nanowires that have undergone this acid treatment perform better than electrodes obtained with nanowires that have not made contact with an acid. The pH is preferably higher than 0.1.

In addition, the inventors have noted that even when the silver nanowires brought into contact with the acid solution such as defined above are already in a transparent electrical material, the performance of such a layer, when used as an electrode or flexible heating film, is also clearly improved.

The acid solution may be an aqueous solution, an alcoholic solution or a hydroalcoholic solution or even a solution in any other solvent that suggests itself. Preferably, the acid solution will be an aqueous solution.

Although the performances of the transparent electrical material comprising the silver nanowires thus treated or of the transparent electrical material comprising nanowires, itself treated in its entirety by contact with the solution, the best results in terms of the improvement in performance are obtained using nitric acid.

The maximum acid content in the acid solution is 20% by weight, relative to the total weight of the solution.

With a higher acid content, the electrical and optical performances of the transparent electrical material comprising the silver nanowires deteriorates.

The minimum acid content is 0.2% by weight acid, relative to the total weight of the acid solution. Below this limit, the treatment is very long.

The duration of the contact is comprised between 2 and 10 min. Preferably, it is comprised between 2 and 7 min. Most preferably, it is 5 min.

The treatment (contact) with the acid is carried out at room temperature, i.e. at a temperature comprised between 17 and 27° C.

The transparent layer of electrical material comprising silver nanowires, once formed, is a layer of a transparent electrical material in which the silver nanowires form a percolating network.

These networks of nanowires may be subsequently heated up to 200° C., compressed, optionally hot compressed, or subjected to high voltages in order to improve further the performances of the transparent electrical material thus obtained.

Of course, after the contact with the acid solution, the silver nanowires, or the transparent electrical material comprising the silver nanowires, are/is washed with water.

This may be achieved by successive washing/centrifuging treatments in order to remove any residual acid.

When the treatment is carried out on the silver nanowires before the transparent electrical material has been manufactured, the nanowires are then subsequently deposited in order to manufacture the transparent electrical material, in particular a transparent electrode or a heating film.

Alternatively, the silver nanowires may first be deposited on the carrier of the transparent electrical material that itself is completely submerged in the acid solution and then washed.

When the transparent electrical material is an electrode, the electrode may be encapsulated after it has been dried. The encapsulation may, by way of example, be achieved by one of the means mentioned in the NanoMarkets LC document (NanoMarkets, LC|PO Box 3840|Glen Allen, Va. 23058) entitled "Encapsulation and Flexible Substrates for Organic and Dye-Sensitized Photovoltaics"—Nano-306—Published January 2011.

In order to allow the invention to be better understood, several examples of embodiments will be described below by way of purely illustrative and nonlimiting example.

Comparative Example 1

Silver nanowires were manufactured using the following process:

1.766 g of PVP (polyvinylpyrrolidone) was added to 2.6 mg of NaCl (sodium chloride) in 40 ml of EG (ethylene glycol) and the mixture was stirred at 600 rpm at 120° C. until the PVP+NaCl had completely dissolved (about 4-5 minutes).

Using a pipette, this mixture was added dropwise to a solution of 40 ml EG in which 0.68 g of $AgNO_3$ (silver nitrate) was dissolved.

The oil bath was heated to 160° C. and left to stir at 700 rpm for 80 minutes.

Three washes were carried out in methanol while centrifuging at 2000 rpm (revolutions per minute) for 20 min, then the nanowires were precipitated in acetone and lastly redispersed in water or methanol.

Electrodes were produced on Eagle XG glass (Corning) by vaporizing the solution thus obtained using an Aztek A4709 airbrush or by spin coating.

The substrates thus formed had a sheet resistance of 38 ohms/square at 87% transmittance (at 550 nm).

Example 1

Silver nanowires were manufactured using the following process:

1.766 g of PVP (polyvinylpyrrolidone) was added to 2.6 mg of NaCl (sodium chloride) in 40 ml of EG (ethylene glycol) and the mixture was stirred at 600 rpm at 120° C. until the PVP+NaCl had completely dissolved (about 4-5 minutes).

Using a pipette, this mixture was added dropwise to a solution of 40 ml EG in which 0.68 g of AgNO$_3$ (silver nitrate) was dissolved.

The oil bath was heated to 160° C. and left to stir at 700 rpm for 80 min.

Three washes were carried out in methanol while centrifuging at 2000 rpm for 20 min, then the nanowires were precipitated in acetone and lastly redispersed in methanol.

To a tube containing 10 mL of methanol containing silver nanowires, was added 20 mL of aqueous solution of nitric acid in a content of 5% by weight relative to the total weight of the aqueous solution. After manual stirring for 5 minutes, the tubes were centrifuged at 5000 rpm. The liquid phase was eliminated. The nanowires were resuspended in water, washed and redispersed in methanol. This treatment with an acid and the following washes were carried out at room temperature.

Electrodes were produced on Eagle XG glass (Corning) by vaporizing the solution obtained using an Aztek A4709 airbrush or by spin coating.

The substrates thus formed had a sheet resistance of 18 ohms/square at 88% transmittance (at 550 nm).

It may be seen from example 1 and from comparative example 1 that a treatment with nitric acid, even for only 5 min, is enough to improve the performances of the electrodes obtained.

Example 2

Silver nanowires were manufactured using the following process:

1.766 g of PVP (polyvinylpyrrolidone) was added to 2.6 mg of NaCl (sodium chloride) in 40 ml of EG (ethylene glycol) and the mixture was stirred at 600 rpm at 120° C. until the PVP+NaCl had completely dissolved (about 4-5 minutes).

Using a pipette, this mixture was added dropwise to a solution of 40 ml EG in which 0.68 g of AgNO$_3$ (silver nitrate) was dissolved.

The oil bath was heated to 160° C. and left to stir at 700 rpm for 80 min.

Three washes were carried out in methanol while centrifuging at 2000 rpm for 20 min, then the nanowires were precipitated in acetone and lastly redispersed in water.

To an aqueous solution of 10 mL containing silver nanowires, was added 20 mL of an aqueous solution of sulfuric acid in a content of 5% by weight. After manual stirring for 5 min, the tubes were centrifuged at 5000 rpm.

The liquid phase was eliminated.

The nanowires were resuspended in water, washed and redispersed in methanol.

Electrodes were produced on Eagle XG glass (Corning) by vaporizing the solution using an Aztek A4709 airbrush or by spin coating.

The substrates thus formed had a sheet resistance of 27 ohms/square at 88% transmittance (at 550 nm).

It may be seen from examples 1 and 2 and from comparative example 1 that electrode performances are improved both by treating silver nanowires in nitric acid and by treating them in sulfuric acid, but that a treatment in nitric acid is preferable.

Comparative Example 2

Silver nanowires were manufactured using the following process:

1.766 g of PVP (polyvinylpyrrolidone) was added to 2.6 mg of NaCl (sodium chloride) in 40 ml of EG (ethylene glycol) and the mixture was stirred at 600 rpm at 120° C. until the PVP+NaCl had completely dissolved (about 4-5 minutes).

Using a pipette, this mixture was added dropwise to a solution of 40 ml EG in which 0.68 g of AgNO$_3$ (silver nitrate) was dissolved.

The oil bath was heated to 160° C. and left to stir at 700 rpm for 80 min.

Three washes were carried out in methanol while centrifuging at 2000 rpm for 20 min, then the nanowires were precipitated in acetone and lastly redispersed in methanol.

Electrodes were produced on 125 μm-thick polyethylene naphthalate (PEN) by vaporizing the solution obtained using an Aztek A4709 airbrush.

The electrodes thus manufactured had a sheet resistance of 28 ohms/square at 83% transmittance (at 550 nm).

Example 3

The electrodes described in the comparative example were submerged for 15 minutes in a solution containing 5% by weight nitric acid, then rinsed in water and dried.

The sheet resistance measured was then 13 ohms/square at 84% transmittance (at 550 nm).

This performance was preserved at least for a plurality of months.

Example 4

The electrodes described in the comparative example were submerged for 15 minutes in a solution containing 5% by weight sulfuric acid, then rinsed in water and dried.

The sheet resistance measured was then 21 ohms/square at 83% transmittance (at 550 nm).

Example 5

The electrodes described in the comparative example were submerged for 15 minutes in a solution containing 5% by weight acetic acid, then rinsed in water and dried.

The performance measured was then: a sheet resistance of 26 ohms/square at 83% transmittance (at 550 nm).

The electrodes or layers of electrical or optical materials according to the invention may, for example, be used in photovoltaic cells, touch screens, (OLED, PLED, LCD, thermochromic) display screens, photodetectors, heating films, organic transistors and films for electromagnetic shielding.

The invention claimed is:

1. A process for manufacturing a layer made of a transparent electrically conductive material based on silver nanowires, wherein the process comprises:

a) a step of bringing the silver nanowires into contact with a solution of nitric acid, said solution of nitric acid having a nitric acid content higher than or equal to 0.2% and lower than or equal to 20% by weight of nitric acid relative to the total weight of the solution during a period comprised between 2 and 10 min. at room temperature; and b) a step of removing the nitric acid.

2. A process for manufacturing a transparent conductive electrode, comprising a step of bringing silver nanowires into contact with a solution of nitric acid, said solution of nitric acid having a nitric acid content higher than or equal to 0.2% and lower than or equal to 20% by weight of nitric acid relative to the total weight of the solution; and b) a step of removing the nitric acid.

3. The process as claimed in claim 1, wherein steps a) and b) are carried out on the silver nanowires before the transparent electrical material is manufactured.

4. The process as claimed in claim 1, wherein steps a) and b) are carried out once the transparent electrical material has been manufactured.

5. The process as claimed in claim 1, further comprising a step of depositing the silver nanowires on a substrate.

6. The process as claimed in claim 2, wherein steps a) and b) are carried out on the silver nanowires before the transparent conductive electrode is manufactured.

7. The process as claimed in claim 2, wherein steps a) and b) are carried out once the transparent conductive electrode has been manufactured.

8. The process as claimed in claim 1, wherein in the step a) said solution of nitric acid has a nitric acid content of 5% by weight relative to the total weight of the solution and the contact duration is of 5 min.

9. The process as claimed in claim 2, wherein in the step a) said solution of nitric acid has a nitric acid content of 5% by weight relative to the total weight of the solution and the duration of the contact is of 5 min.

* * * * *